(12) United States Patent
Moldenhauer et al.

(10) Patent No.: US 9,411,017 B2
(45) Date of Patent: Aug. 9, 2016

(54) METHOD FOR INSPECTING WYE RING

(71) Applicant: General Electric Company, Schenectady, NY (US)

(72) Inventors: Thomas Earnest Moldenhauer, Burnt Hills, NY (US); Thomas James Batzinger, Burnt Hills, NY (US); Francis Alexander Reed, Duanesburg, NY (US); Michael Charles Freda, Long Beach Township, NJ (US)

(73) Assignee: General Electric Company, Schenectady, NY (US)

( * ) Notice: Subject to any disclaimer, the term of this patent is extended or adjusted under 35 U.S.C. 154(b) by 493 days.

(21) Appl. No.: 14/089,915

(22) Filed: Nov. 26, 2013

(65) Prior Publication Data
US 2015/0145554 A1 May 28, 2015

(51) Int. Cl.
*G01R 31/34* (2006.01)

(52) U.S. Cl.
CPC .............. *G01R 31/346* (2013.01); *F03D 17/00* (2016.05); *G01R 31/343* (2013.01); *Y02E 10/722* (2013.01)

(58) Field of Classification Search
CPC ..... G01R 31/346; G01R 31/343; F03D 17/00
See application file for complete search history.

(56) References Cited

U.S. PATENT DOCUMENTS

| 4,238,733 | A | 12/1980 | Freeman |
| 5,548,214 | A | 8/1996 | Yasohama et al. |
| 6,868,357 | B2 | 3/2005 | Furse |
| 7,139,668 | B2 | 11/2006 | Bechhoefer |
| 8,028,581 | B2 | 10/2011 | Perkins et al. |
| 2004/0000923 | A1 | 1/2004 | Fischer et al. |
| 2005/0035768 | A1 | 2/2005 | Rabach et al. |
| 2007/0057677 | A1 | 3/2007 | Koch et al. |
| 2011/0169504 | A1 | 7/2011 | Pekola et al. |
| 2013/0076389 | A1 | 3/2013 | Wilson et al. |

FOREIGN PATENT DOCUMENTS

| DE | 2420166 A1 | 11/1975 |
| EP | 0228012 A1 | 7/1987 |
| WO | 2013/045541 A1 | 4/2013 |

OTHER PUBLICATIONS

Yeboah et al., Refurbishment of the KCP&L La Cygne Hydrogen Cooled Brushless Exciter, Ninth EPRI Steam Turbine/Generator Workshop, Denver, 2005.*

European Search Report and Opinion issued in connection with corresponding EP Application No. 141947796 on May 7, 2015.

* cited by examiner

Primary Examiner — Daniel Miller
(74) Attorney, Agent, or Firm — James W. Pemrick; Ernest G. Cusick; Frank A. Landgraff

(57) ABSTRACT

A method for inspecting a wye ring in a generator includes the steps of dismantling the generator to gain access to the wye ring and at least a portion of a rotor, applying a test signal to the rotor and measuring an inductive voltage at two or more locations near the wye ring. A comparing step compares results from the measuring step to determine if a fault exists in the wye ring. A predetermined difference in inductive voltage measurements indicates presence of the fault.

20 Claims, 6 Drawing Sheets

METHOD FOR INSPECTING WYE RING

BACKGROUND OF THE INVENTION

The method described herein relates generally to generator inspection. More specifically, the method relates to inspecting a wye ring in a generator.

At least some known wind turbines include machines for converting variable speed mechanical input from blades of the wind turbine into electric power that is compliant with an electrical grid. For example, wind turbines may include a doubly fed induction generator (DFIG) for converting the variable speed mechanical input.

Some known DFIG generator rotors have a floating neutral point. This is frequently provided by a wye ring. The wye ring is typically made from a copper bar and is located at the non-drive end (NDE) of the generator. Due to operational stresses which fatigue the brazed connection between the wye ring and its rotor connection points (or connection lugs), cracks can develop which lead to discontinuity. When the first crack occurs, the generator continues to function satisfactorily since the current can still reach all three rotor connection points. However, if a second crack occurs in the wye ring, at least one part (e.g., one phase) of the rotor windings are now disconnected from the floating neutral. This results in severe arcing across one of the cracks, and leads to failure of the insulation around the wye ring. Eventually, cross-over arcing occurs between the wye ring and the phase lead, and significant damage can occur (e.g., fire). The wind turbine monitoring system detects this cross-over arcing condition and recognizes it as a phase fault, and accordingly shuts the wind turbine down.

BRIEF DESCRIPTION OF THE INVENTION

In an aspect of the present invention, a method for inspecting a wye ring in a generator includes the steps of dismantling the generator to gain access to the wye ring and at least a portion of a rotor, applying a test signal to the rotor and measuring an inductive voltage at two or more locations near the wye ring. A comparing step compares results from the measuring step to determine if a fault exists in the wye ring. A predetermined difference in inductive voltage measurements indicates presence of the fault.

In another aspect of the present invention, a method for inspecting a wye ring in a generator includes the steps of, applying a test signal to the rotor, and measuring an inductive voltage at two or more locations near the wye ring. A comparing step compares results from the measuring step to determine if a fault exists in the wye ring. A predetermined difference in inductive voltage measurements indicates presence of the fault. The method may be performed on the generator in-situ.

DETAILED DESCRIPTION OF THE INVENTION

One or more specific aspects/embodiments of the present invention will be described below. In an effort to provide a concise description of these aspects/embodiments, all features of an actual implementation may not be described in the specification. It should be appreciated that in the development of any such actual implementation, as in any engineering or design project, numerous implementation-specific decisions must be made to achieve the developers' specific goals, such as compliance with machine-related, system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements. Any examples of operating parameters and/or environmental conditions are not exclusive of other parameters/conditions of the disclosed embodiments. Additionally, it should be understood that references to "one embodiment", "one aspect" or "an embodiment" or "an aspect" of the present invention are not intended to be interpreted as excluding the existence of additional embodiments or aspects that also incorporate the recited features.

Figure 1:
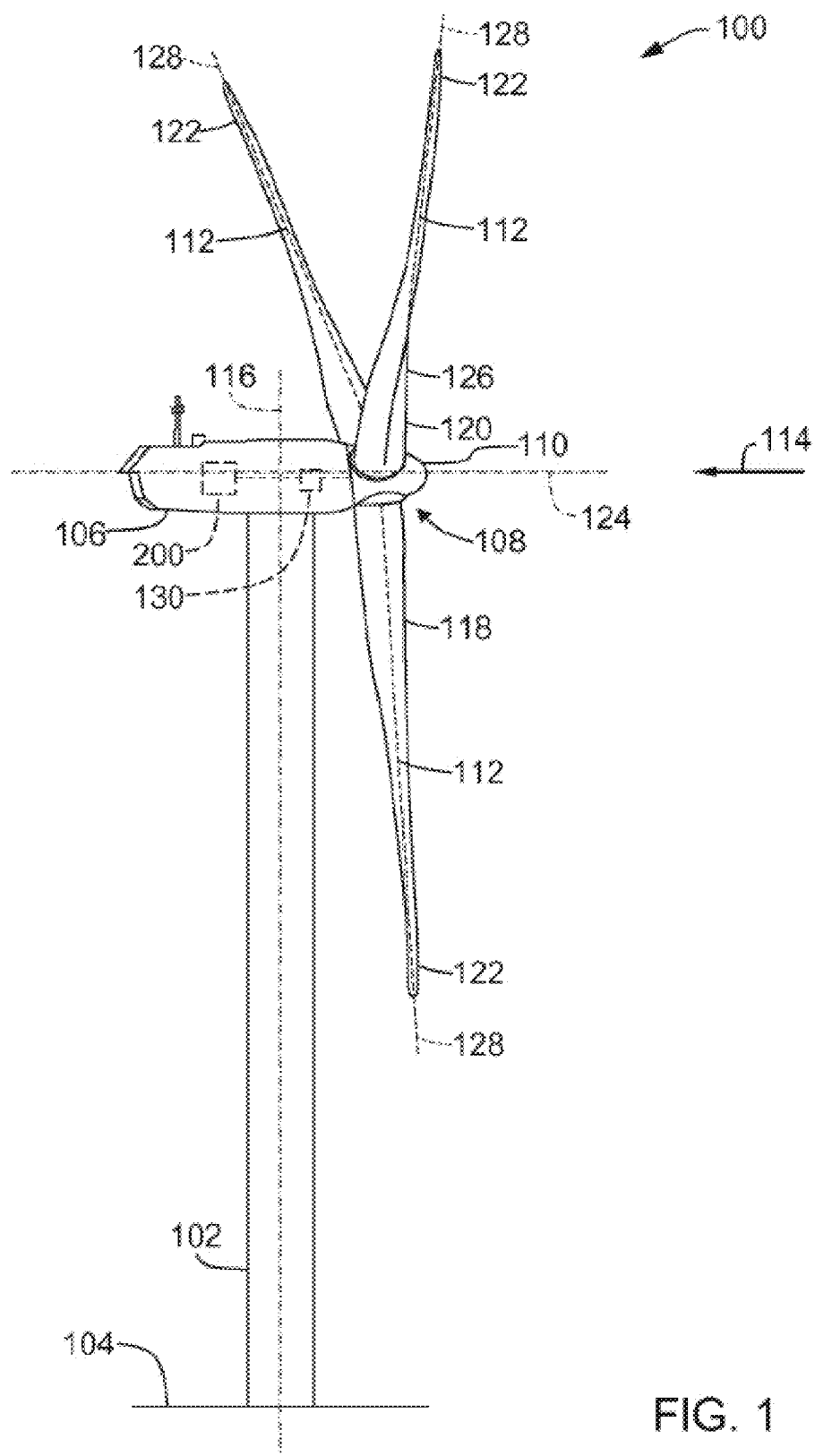
FIG. 1 is a perspective view of an exemplary wind turbine.

FIG. 1 is a schematic view of an exemplary wind turbine 100. In the exemplary embodiment, wind turbine 100 is a horizontal-axis wind turbine. Alternatively, wind turbine 100 may be a vertical-axis wind turbine. In the exemplary embodiment, wind turbine 100 includes a tower 102 extending from and coupled to a supporting surface 104. Tower 102 may be coupled to surface 104 with anchor bolts or via a foundation mounting piece (neither shown), for example. A nacelle 106 is coupled to tower 102, and a main shaft assembly 108 is coupled to nacelle 106. Main shaft assembly 108 includes a rotatable hub 110 and a plurality of rotor blades 112 coupled to hub 110. In the exemplary embodiment, main shaft assembly 108 includes three rotor blades 112. Alternatively, main shaft assembly 108 may have any suitable number of rotor blades 112 that enables wind turbine 100 to function as described herein. Tower 102 may have any suitable height and/or construction that enables wind turbine 100 to function as described herein.

Rotor blades 112 are spaced about hub 110 to facilitate rotating main shaft assembly 108, thereby transferring kinetic energy from wind 114 into usable mechanical energy, and subsequently, electrical energy. Main shaft assembly 108 and nacelle 106 are rotated about tower 102 on a yaw axis 116 to control a perspective of rotor blades 112 with respect to a direction of wind 114. Rotor blades 112 are mated to hub 110 by coupling a rotor blade root portion 118 to hub 110 at a plurality of load transfer regions 120. Load transfer regions 120 each have a hub load transfer region and a rotor blade load transfer region (both not shown in FIG. 1). Loads induced to rotor blades 112 are transferred to hub 110 via load transfer regions 120. Each rotor blade 112 also includes a rotor blade tip portion 122.

In the exemplary embodiment, rotor blades 112 have a length of between approximately 30 meters (m) (99 feet (ft)) and approximately 120 m (394 ft). Alternatively, rotor blades 112 may have any suitable length that enables wind turbine 100 to function as described herein. For example, rotor blades 112 may have a suitable length less than 30 m or greater than 120 m. As wind 114 contacts rotor blade 112, lift forces are induced to rotor blade 112 and rotation of main shaft assembly 108 about an axis of rotation 124 is induced as rotor blade tip portion 122 is accelerated.

A pitch angle (not shown) of rotor blades 112, i.e., an angle that determines the perspective of rotor blade 112 with respect to the direction of wind 114, may be changed by a pitch assembly (not shown in FIG. 1). More specifically, increasing a pitch angle of rotor blade 112 decreases an amount of rotor blade surface area 126 exposed to wind 114 and, conversely, decreasing a pitch angle of rotor blade 112 increases an amount of rotor blade surface area 126 exposed to wind 114. The pitch angles of rotor blades 112 are adjusted about a pitch axis 128 at each rotor blade 112. In the exemplary embodiment, the pitch angles of rotor blades 112 are controlled individually. Further, wind turbine 100 includes a main gearbox 130 and a generator 200 within nacelle 106. In the exemplary embodiment, main shaft assembly 108 includes a low-speed shaft (not shown in FIG. 1) that extends into main gearbox 130 and a high-speed shaft (not shown in FIG. 1) extends to generator 200.

Figure 2:
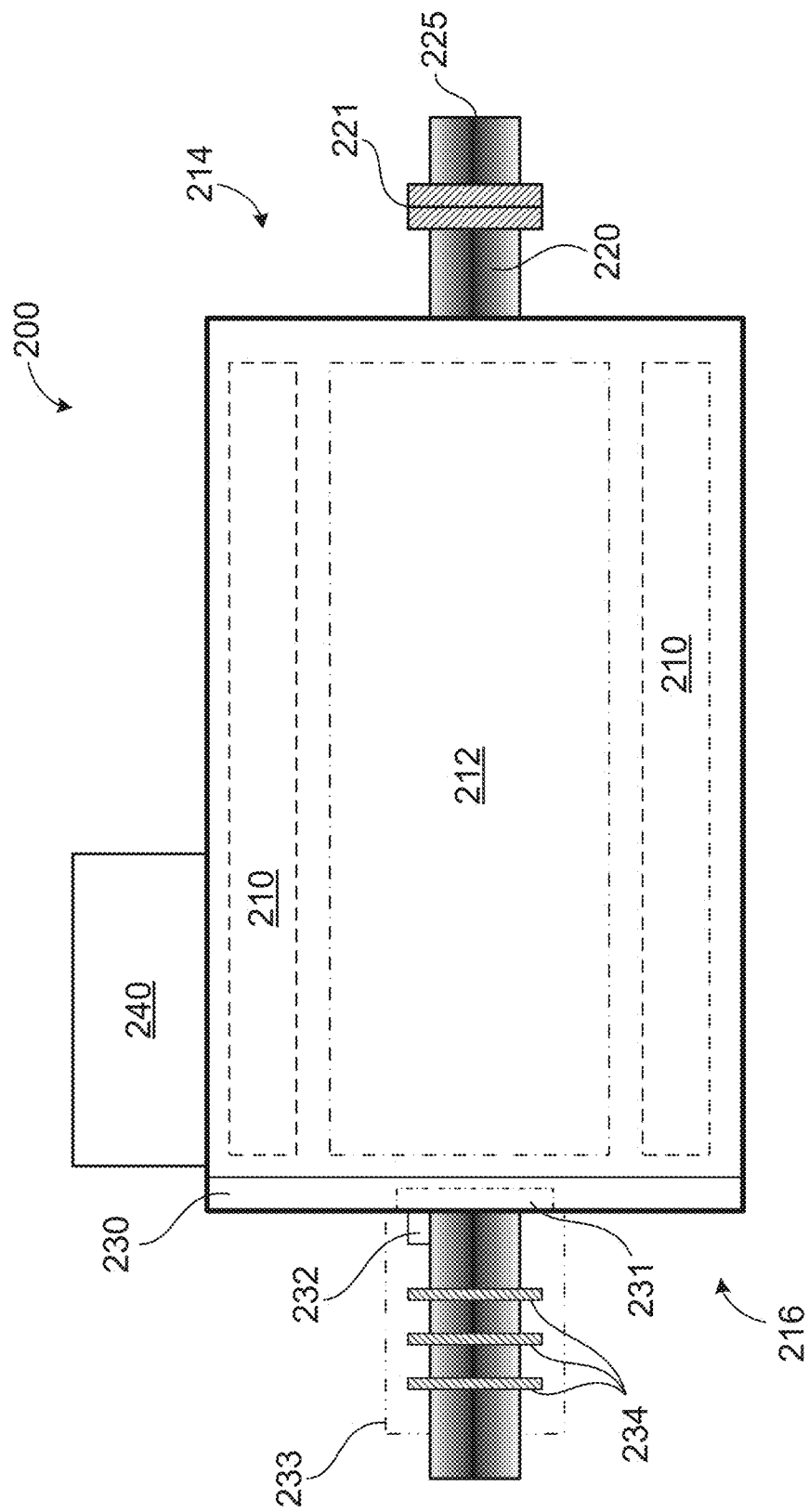
FIG. 2 illustrates a schematic view of a known generator.

FIG. 2 illustrates a schematic view of generator 200. Generator 200 includes a stator (or field) 210 and rotor (or armature) 212. The generator input shaft 220 is coupled to the gearbox output shaft 225 via a coupling 221. Typically, coupling 221 is a bolted flange configuration. The generator input shaft 220 is located at the drive end (DE) 214 of the generator. The opposing end of the generator 200 is the non-drive end (NDE) 216. The non-drive end 216 includes a bearing shield 230. The bearing shield 230 may also include an inner bearing cover 231, and the outside of the bearing shield 230 may be configured for attachment of an oil slinger 232, and a slip ring housing 233 containing slip rings 234. A heat exchanger 240 is located at the top of the generator 200.

Figure 3:
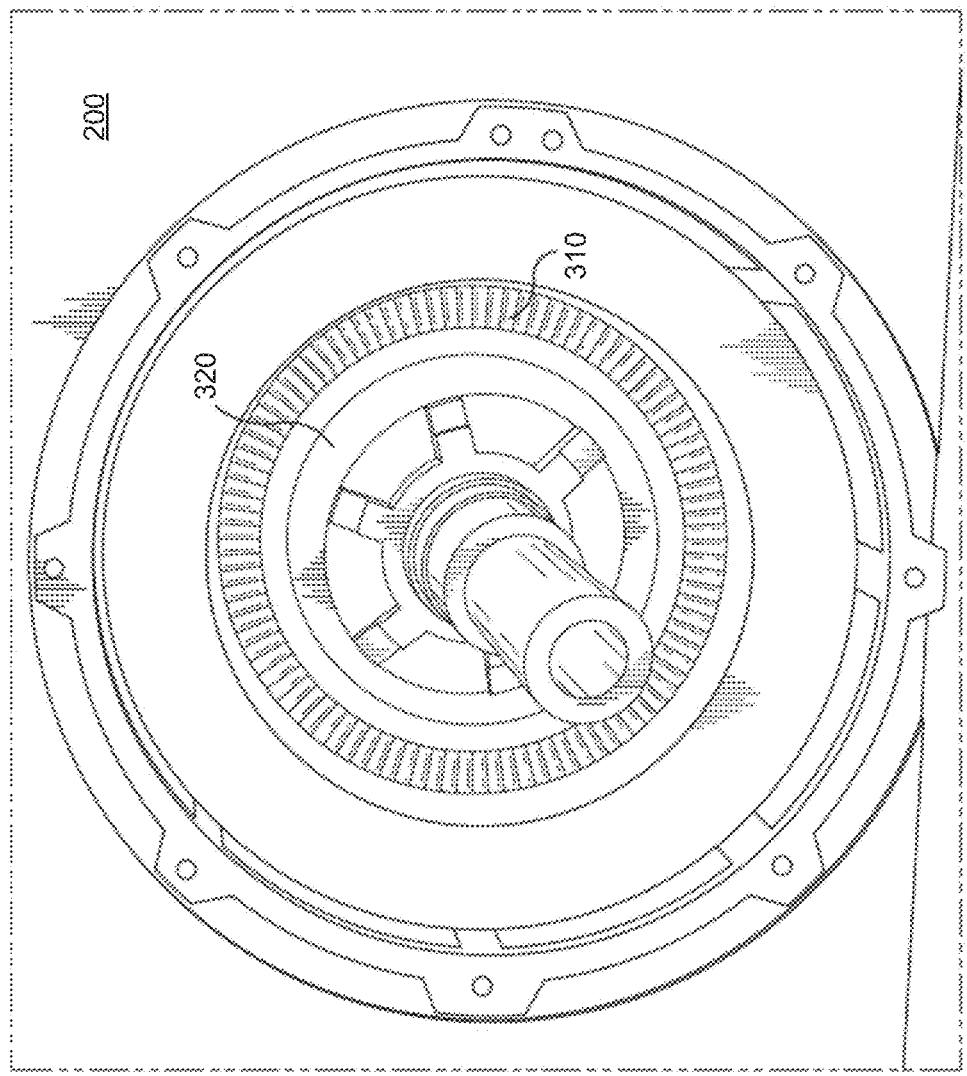
FIG. 3 illustrates a perspective view of the non-drive end of a generator.

FIG. 3 illustrates a perspective view of the non-drive end 216 of generator 200 with the rotor fan removed. The rotor's end windings 310 extend circumferentially around the rotor. The end-windings 310 are connected to a wye-ring 320 that is fit radially inside the end windings 310. The wye ring 320 is typically one or more copper bars curved into a generally circular shape, and the wye ring 320 provides a floating neutral connection for the (typically) three phases of the rotor windings. The wye ring 320 is normally insulated by wrapping and/or encapsulating in dielectric material.

Figure 4:
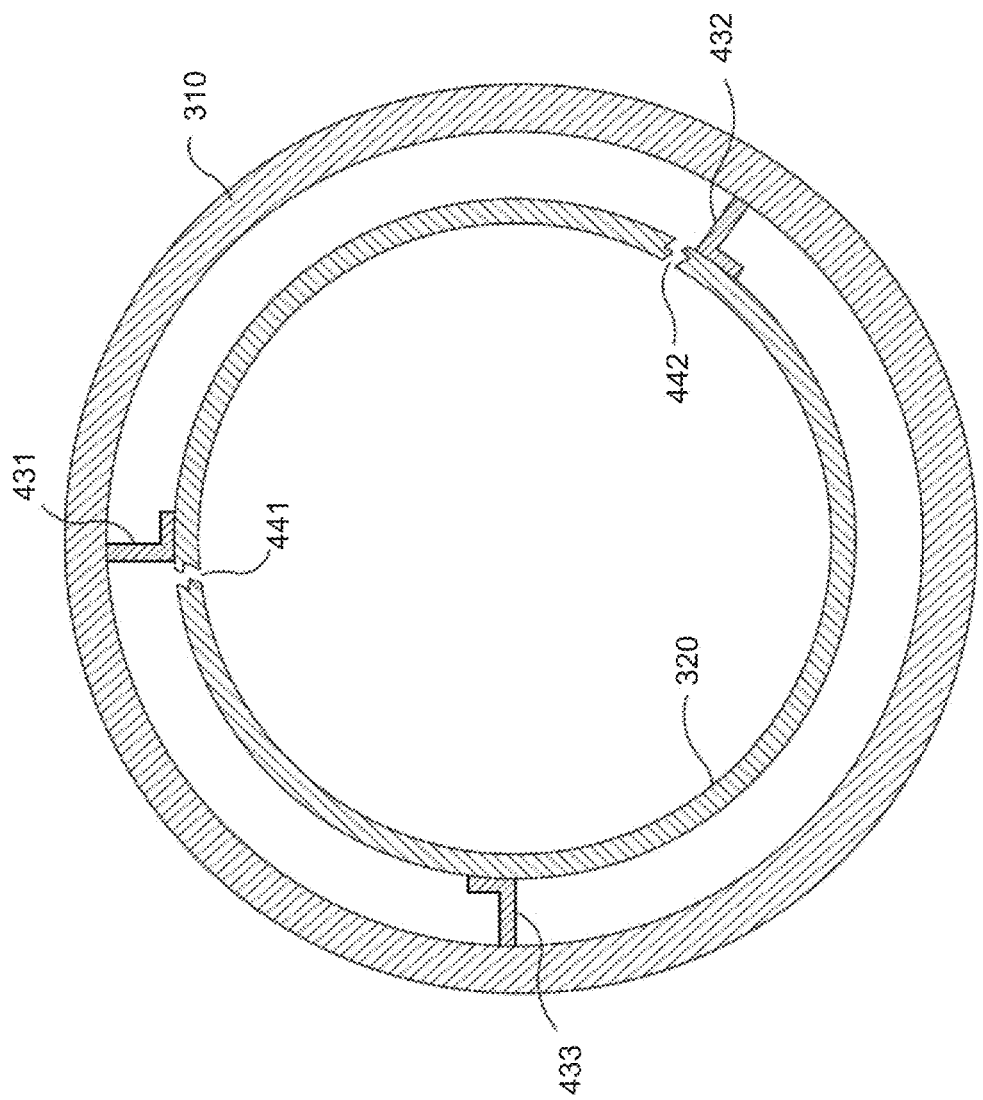
FIG. 4 illustrates a schematic view of the rotor end windings connected to the wye ring.

Operational wear and tear, and vibrations can cause cracks in the wye ring 320. If two or more cracks develop, the generator malfunctions and must be shut down. FIG. 4 illustrates a schematic view of the rotor end windings 310 connected to the wye ring 320. Connection lugs 431, 432 and 433 are used to electrically connect the wye ring 320 to the end windings 310. Typically, the connection lugs are brazed to the wye ring 320 as both are made of copper. The brazed joint experiences strain (due to mechanical vibrations, thermal expansion/contraction, etc.) during operation of the generator. For example, thermal expansion and contraction may not be uniform between the rotor end windings 310 and the wye ring 320, and this uneven expansion and contraction stresses the brazed joint as well as the wye ring itself. Unfortunately, after an extended period of time a crack 441 may form in the wye ring near connection lug 431. A single crack is not catastrophic, as current can still flow to the two remaining connection lugs. However, crack 441 does impose additional loads on the other two connection lugs 432 and 433. If a second crack 442 develops near connection lug 432, one of the phases (via connection lug 431) is now isolated from the floating neutral. Arcing between the cracks will degrade the insulation and will trigger machine faults. Furthermore, the wye ring is typically insulated so it is difficult to visually identify if cracks exist, and some cracks may be early in their formation and would be very difficult or impossible to detect with a visual inspection.

Figure 5:
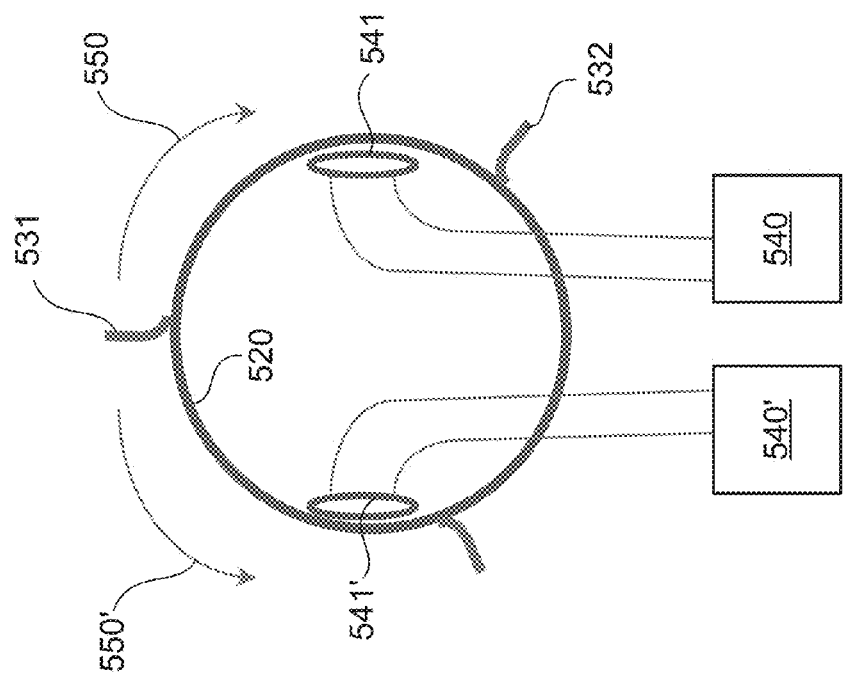
FIG. 5 illustrates a schematic view of a system for testing a wye ring used in a generator, according to an aspect of the present invention.

FIG. 5 illustrates a schematic view of a system for testing a wye ring 520 used in a generator, according to an aspect of the present invention. The wye ring 520 contains no cracks and is in normal operational condition, as current conducts evenly through the wye ring. To test for possible cracks or breaks, a test signal comprised of an alternating current (e.g., about 10 volts peak-peak, 1 MHz) is applied to connection lug 531, and connection lug 532 is connected to ground. It is to be understood that any two connection lugs may be used and that the test signal may be of any suitable voltage and frequency, as desired in the specific application. A test device 540 (e.g., an oscilloscope) connected to a radio frequency (RF) coil 541 is placed next to the wye ring 520. The test device 540 and RF coil 541 will detect inductive voltages and the result will be displayed and/or recorded on the test device 540. The current flow direction through the wye ring 520 is indicated by arrows 550 and 550'. A secondary reading is taken on a different portion of the wye ring 520, and this is indicated by the position of test device 541' and RF coil 541'. If the wye ring 520 has no cracks, then the detected voltages at each location will be substantially equal (e.g., each reading will be about 5 volts P-P). In typical use, test device 540 and RF coil 541 are the same devices as test device 540' and RF coil 541', and the only difference is that the RF coil has been moved to a different location along the wye ring.

Figure 6:
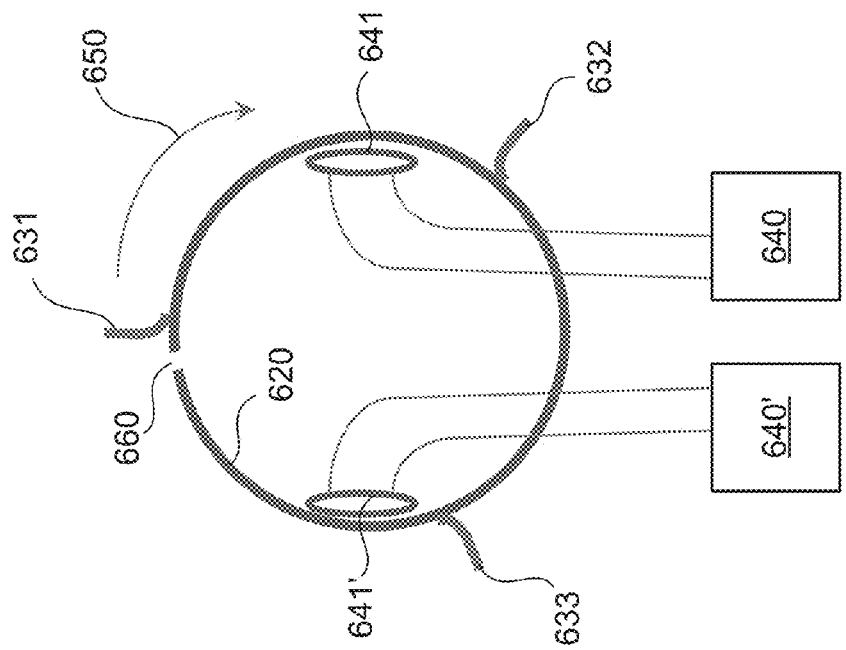
FIG. 6 illustrates a schematic view of a system for testing a wye ring having a fault, according to an aspect of the present invention.

FIG. 6 illustrates a schematic view of a system for testing a wye ring 620 used in a generator, according to an aspect of the present invention. The wye ring 620 contains crack 660 and is in need of repair, but will still function, as current conducts from all phases to ground. The test for possible cracks or breaks is the same as described in conjunction with FIG. 5. A test signal comprised of an alternating current (e.g., about 10 volts peak-peak, 1 MHz) is applied to connection lug 631, and connection lug 632 is connected to ground. A test device 640 (e.g., an oscilloscope) connected to a radio frequency (RF) coil 641 is placed next to the wye ring 620. The test device 640 and RF coil 641 detect inductive voltages and the result is displayed and/or recorded on the test device 640. The current flow direction through the wye ring 620 is indicated by arrow 650. There may be a small induced voltage in the upper left leg of the wye ring, due to the magnetic field strength in the good upper right leg. A secondary reading is taken on a different portion of the wye ring 620, and this is indicated by the position of test device 641' and RF coil 641'. Due to the presence of crack 660, the detected voltages at each location will be substantially different. For example, the induced voltage on the upper right leg (near coil 641) may be about 10 volts P-P, while the induced voltage on the upper left leg (near coil 641') may be about 0.5 volts P-P. By comparing the inductive measurement results, one can determine if a fault (or crack) exists in wye ring 620. In this example, the difference between inductive voltage measurements was 9.5 volts, or an absolute percentage change of 95%. This difference (or change) is due to uneven current flow in the legs of the wye ring and indicates a fault (e.g., a break or crack). Current flows unimpeded from connection lug 631 to connection lug 632 along the wye ring, but current flow is restricted (or prevented) from flowing through the wye ring section between connection lugs 631 and 633. The predetermined difference used for indicating the presence of a fault may be about 3 volts to about 9 volts or about 35% to about 100%, or any other voltage range or percent range as desired in the specific application and/or based on the specific voltages applied as the test signal.

Figure 7:
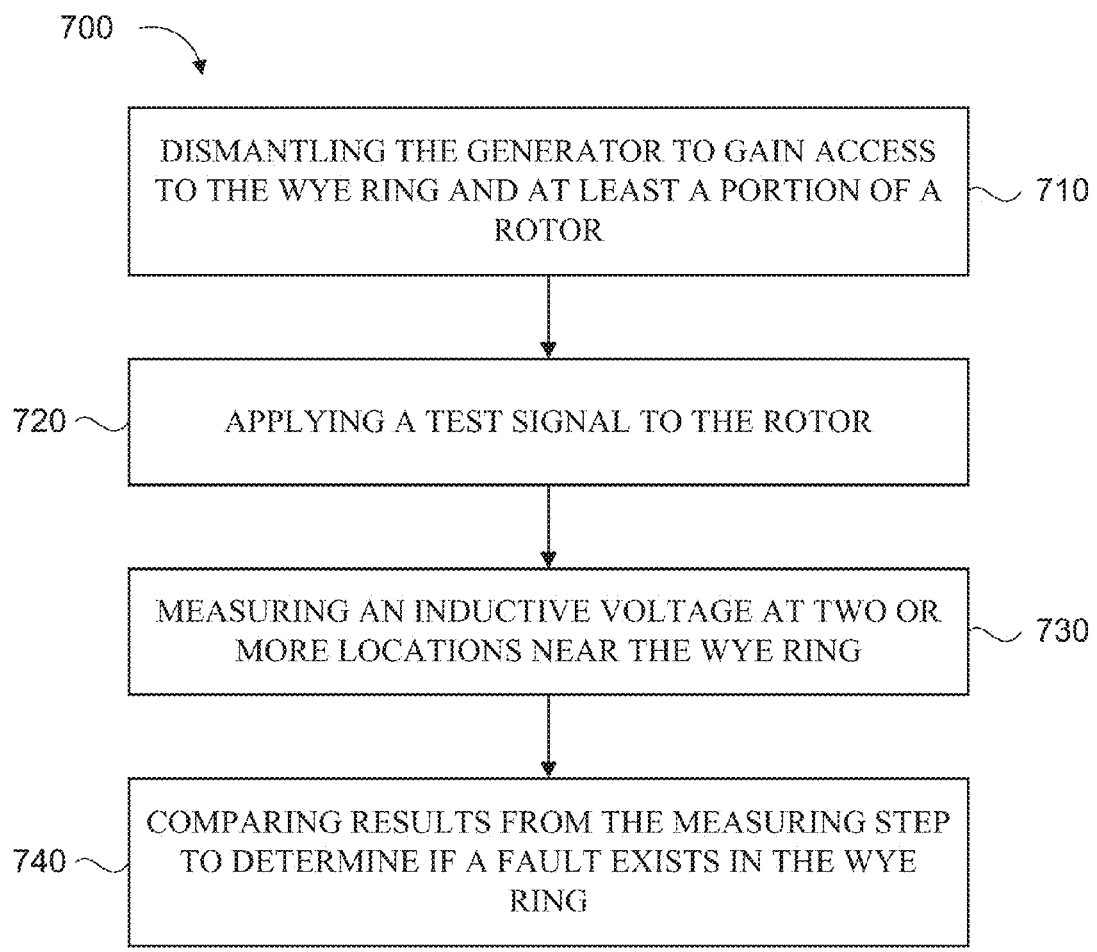
FIG. 7 illustrates a flowchart for a method for inspecting a wye ring in a generator, according to an aspect of the present invention.

FIG. 7 illustrates a flowchart for a method 700 for inspecting a wye ring in a generator, according to an aspect of the present invention. The method may include a dismantling step 710 where the generator is partially dismantled to gain access to the wye ring and at least a portion of a rotor. This step may include moving a heat exchanger to gain access to the wye ring, and/or removing a slip ring housing and a bearing shield from the generator. Step 720 includes applying a test signal to the rotor. This step may include applying the test signal to two connection lugs of the generator, where a first connection lug is grounded and a second connection lug receives the test signal. The connection lugs are electrically connected to the wye ring enabling transmission/conduction of the test signal. The first connection is electrically connected to a first phase of the rotor and the second connection is electrically connected to a second phase of the rotor. As one example only, the test signal may be an alternating current (AC) of about 10 volts and at a frequency of about 1 MHz. However, any suitable voltage or frequency of alternating current may be used for the test signal, as desired in the specific application.

A measuring step 730 includes measuring an inductive voltage at two or more locations near or along the wye ring. This step may include measuring the inductive voltage with a radio frequency (RF) pickup coil at multiple locations, and these locations may be spaced by about 120 degrees along the wye ring. The inductive voltage may be measured on both sides of the second connection lug along the wye ring, where the first connection lug is connected to ground and the second connection lug receives the test signal. The measurement points span the wye ring and are between each of the first connection lug 431, the second connection lug 432 and the third connection lug 433. It is preferable if all three spaces (along the wye ring) between the connection lugs are measured. A comparing step 740 is used for comparing results from the measuring step 730 to determine if a fault exists in the wye ring. A predetermined difference (or change) in inductive voltage measurements indicates presence of the fault. For example, an evaluation of the difference between inductive voltage measurements at different locations along the wye ring is performed, and a difference of about 35% to about 100% indicates the presence of the fault. As one example only, a difference of about 50% or more indicates the presence of a fault. This is due to unequal current flow along the wye ring. If there is no fault (e.g., a crack), then the inductive voltage should be substantially the same when measured at multiple locations. The method 700 may also be performed on the generator in-situ or up-tower.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for inspecting a wye ring in a generator, the method comprising the steps of:
   dismantling the generator to gain access to the wye ring and at least a portion of a rotor;
   applying a test signal to the rotor;
   measuring an inductive voltage at each of two or more locations near the wye ring while applying the test signal to the rotor;
   comparing results from the measuring step to determine if a fault exists in the wye ring, a predetermined difference between the inductive voltage measurements indicating presence of the fault.

2. The method of claim 1, the dismantling step further comprising:
   moving a heat exchanger to gain access to the wye ring.

3. The method of claim 1, the dismantling step further comprising:
   removing a slip ring housing and a bearing shield from the generator.

4. The method of claim 1, the applying step further comprising:
   applying the test signal to two connection lugs of the generator, a first connection lug being grounded and a second connection lug receiving the test signal, wherein the connection lugs are electrically connected to the wye ring, and wherein the first connection lug is electrically connected to a first phase of the rotor and the second connection lug is electrically connected to a second phase of the rotor.

5. The method of claim 4, the test signal comprising an alternating current (AC) at about 1 MHz.

6. The method of claim 5, the test signal comprising a voltage of about 10 volts.

7. The method of claim 1, the measuring step further comprising:
   measuring the inductive voltages with a radio frequency (RF) pickup coil.

8. The method of claim 7, the measuring step further comprising:
   measuring the inductive voltage on both sides of a second connection lug along the wye ring; wherein
   a first connection lug is connected to ground and the second connection lug receives the test signal, and wherein the connection lugs are electrically connected to the wye ring.

9. The method of claim 7, the measuring step further comprising:
   measuring the inductive voltages at points spaced by about 120 degrees along the wye ring; and wherein the points span the wye ring and are between each of a first connection lug, a second connection lug and a third connection lug.

10. The method of claim 1, the comparing step further comprising:
    evaluating the difference between inductive voltage measurements at different locations along the wye ring, and wherein
    a difference of about 50% or more indicating presence of the fault.

11. The method of claim 1, wherein the method is performed on the generator in-situ.

12. The method of claim 1, the applying step further comprising:

applying the test signal to a first connection lug and a second connection lug, the first connection lug connected to the wye ring and a first phase of the rotor, the second connection lug connected to the wye ring and a second phase of the rotor;

applying the test signal to the second connection lug and a third connection lug, the third connection lug connected to the wye ring and a third phase of the rotor; and applying the test signal to the first connection lug and the third connection lug.

13. A method for inspecting a wye ring in a generator, the method comprising the steps of:

applying a test signal to the rotor;

measuring an inductive voltage at each of two or more locations near the wye ring while applying the test signal to the rotor;

comparing results from the measuring step to determine if a fault exists in the wye ring, a predetermined difference between the inductive voltage measurements indicating presence of the fault; and wherein the method is performed on the generator in-situ.

14. The method of claim 13, the applying step further comprising:

applying the test signal to two connection lugs of the generator, a first connection lug being grounded and a second connection lug receiving the test signal, wherein the two connection lugs are electrically connected to the wye ring.

15. The method of claim 14, the test signal comprising an alternating current (AC) at about 1 MHz and having a voltage of about 10 volts.

16. The method of claim 14, the measuring step further comprising:

measuring the inductive voltages with a radio frequency (RF) pickup coil.

17. The method of claim 13, the measuring step further comprising:

measuring the inductive voltage on both sides of a second connection lug along the wye ring; wherein a first connection lug is connected to ground and the second connection lug receives the test signal, and wherein the connection lugs are electrically connected to the wye ring.

18. The method of claim 13, the measuring step further comprising:

measuring the inductive voltages at points spaced by about 120 degrees along the wye ring; and wherein the points span the wye ring and are between each of a first connection lug, a second connection lug and a third connection lug.

19. The method of claim 13, the comparing step further comprising:

evaluating the difference between inductive voltage measurements at different locations along the wye ring, and wherein a difference of about 50% or more indicating presence of the fault.

20. The method of claim 13, the applying step further comprising:

applying the test signal to a first connection lug and a second connection lug, the first connection lug connected to the wye ring and a first phase of the rotor, the second connection lug connected to the wye ring and a second phase of the rotor;

applying the test signal to the second connection lug and a third connection lug, the third connection lug connected to the wye ring and a third phase of the rotor; and applying the test signal to the first connection lug and the third connection lug.

* * * * *